(12) United States Patent  
Park et al.

(10) Patent No.: US 12,399,305 B2
(45) Date of Patent: Aug. 26, 2025

(54) FOLDABLE DISPLAY DEVICE (71) Applicant: LG Display Co., Ltd., Seoul (KR)

(72) Inventors: Youngjoo Park, Busan (KR); Seungkyu Lee, Bucheon-si (KR); Sejin Jang, Paju-si (KR); Jungmin Lee, Seoul (KR); Taehyoung Kwak, Goyang-si (KR); Hyesun Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/505,541

(22) Filed: Nov. 9, 2023

(65) Prior Publication Data

US 2024/0081092 A1    Mar. 7, 2024

Related U.S. Application Data

(63) Continuation of application No. 18/488,733, filed on Oct. 17, 2023, which is a continuation of application No. 17/116,563, filed on Dec. 9, 2020.

(30) Foreign Application Priority Data

Dec. 27, 2019  (KR) .......................... 10-2019-0176635

(51) Int. Cl.
| | |
|---|---|
| *H10K 50/84* | (2023.01) |
| *G02B 1/14* | (2015.01) |
| *H10K 50/86* | (2023.01) |
| *H10K 59/12* | (2023.01) |
| *H10K 59/80* | (2023.01) |
| *H10K 77/10* | (2023.01) |
| *H10K 102/00* | (2023.01) |

(52) U.S. Cl.
CPC ............. *G02B 1/14* (2015.01); *H10K 50/841* (2023.02); *H10K 50/86* (2023.02); *H10K 59/12* (2023.02); *H10K 59/871* (2023.02); *H10K 77/111* (2023.02); *H10K 59/873* (2023.02); *H10K 59/8791* (2023.02); *H10K 2102/311* (2023.02)

(58) Field of Classification Search
None
See application file for complete search history.

(56) References Cited

U.S. PATENT DOCUMENTS

2014/0204054 A1* 7/2014 Kim ...................... G06F 3/0412
                                                          345/174
2015/0132552 A1   5/2015 Kang et al.
(Continued)

FOREIGN PATENT DOCUMENTS

| CN | 102792218 A | 11/2012 |
|---|---|---|
| CN | 104108213 A | 10/2014 |

(Continued)

*Primary Examiner* — Anthony J Frost
(74) *Attorney, Agent, or Firm* — Seed Intellectual Property Law Group LLP (57) ABSTRACT

A foldable display device includes a foldable display panel and a foldable cover window disposed on the foldable display panel. The foldable cover window includes a flexible film and a first hard coating layer located on the flexible film with the first hard coating layer including a base material in combination with a linker material. The base material is a siloxane-based resin and the linker material is one of: a urethane-acrylic-based linker, an acrylic-based linker, and an epoxy-based linker.

10 Claims, 5 Drawing Sheets

(56) References Cited

U.S. PATENT DOCUMENTS

| | | |
|---|---|---|
| 2015/0144912 A1 | 5/2015 | Park |
| 2015/0207102 A1 | 7/2015 | Jeong et al. |
| 2016/0014881 A1 | 1/2016 | Shin et al. |
| 2016/0355704 A1* | 12/2016 | Takarada ............ G02B 5/3033 |
| 2017/0263891 A1* | 9/2017 | Oh ...................... H10K 77/111 |
| 2018/0053451 A1* | 2/2018 | Han ..................... G06F 1/1652 |
| 2018/0112049 A1* | 4/2018 | Song ..................... C08G 69/40 |
| 2018/0182838 A1 | 6/2018 | Yeo |
| 2018/0208793 A1 | 7/2018 | Kim et al. |
| 2019/0116405 A1 | 4/2019 | Noh et al. |
| 2019/0165311 A1 | 5/2019 | Lee |
| 2020/0068725 A1 | 2/2020 | Park et al. |

FOREIGN PATENT DOCUMENTS

| | | |
|---|---|---|
| CN | 107003789 A | 8/2017 |
| CN | 107312448 A | 11/2017 |
| CN | 107797165 A | 3/2018 |
| CN | 107867030 A | 4/2018 |
| CN | 107886847 A | 4/2018 |
| CN | 108074490 A | 5/2018 |
| CN | 109473421 A | 3/2019 |
| CN | 109656318 A | 4/2019 |
| CN | 109755277 A | 5/2019 |
| CN | 209199986 U | 8/2019 |
| CN | 112310304 A | 2/2021 |
| KR | 20160053779 A | 5/2016 |
| KR | 20160076040 A | 6/2016 |
| KR | 20160143542 A | 12/2016 |
| KR | 20180021299 A | 3/2018 |
| KR | 20180044189 A | 5/2018 |

* cited by examiner

FOLDABLE DISPLAY DEVICE

CROSS-REFERENCE TO RELATED APPLICATIONS

This application claims the priority benefit of Korean Patent Application No. 10-2019-0176635 filed on Dec. 27, 2019, with the Korean Intellectual Property Office, the disclosure of which is incorporated herein by reference.

BACKGROUND

Technical Field

The present disclosure relates to a foldable display device and more particularly, to a foldable display device having improved reliability.

Description of the Related Art

Display devices used for a computer monitor, a TV, and a mobile phone include an electroluminescence display device that emits light by itself, a liquid crystal display (LCD) device that requires a separate light source, and the like.

Electroluminescence display devices include organic light emitting diode display devices (OLED), inorganic light emitting diode display devices, micro-LED display devices, mini-LED display devices, and the like.

Such display devices are being applied to more and more various fields including not only a computer monitor and a TV, but personal mobile devices, and thus, display devices having a reduced volume and weight while having a wide display area are being studied.

Recently, a foldable display device that can be folded and unfolded about a folding axis by forming a display area, lines, and the like on a flexible substrate has attracted attention as a next-generation display device. However, such devices are limited in their folding ability because they are likely to be damaged at smaller radii of curvature.

BRIEF SUMMARY

One way a folding level of a foldable display device can be characterized is as a threshold curvature radius (RTH) value. The threshold curvature radius value is a value of a curvature radius with which the foldable display device may be damaged. That is, excellent folding characteristics of the foldable display device mean that the threshold curvature radius of the foldable display device has a small value. On the contrary, when the threshold curvature radius increases, it means that some aspects of the folding characteristics of the foldable display device are reduced. A threshold curvature radius value of a specific foldable display device can be defined by a manufacturer or can be defined according to a third party's test result.

The inventors of the present disclosure have recognized that excellent surface hardness, excellent folding characteristics, excellent impact resistance, and excellent dent recovery ability are required for commercialization of a foldable display device. Specifically, the inventors of the present disclosure have recognized that the above-described characteristics are essential performance for mass production of foldable display devices designed to be bent, rolled or folded. Accordingly, the inventors of the present disclosure have studied and developed foldable display devices allowing for improvements in surface hardness, flexibility, impact resistance, and dent recovery ability.

The inventors of the present disclosure have studied a stacked structure of a foldable cover window and a foldable display panel of the foldable display device in order to improve surface hardness, folding characteristics, impact resistance, and dent recovery ability. Here, the foldable cover window may mean a component configured to protect a display surface of the foldable display device. The foldable display panel may mean a foldable panel in which a plurality of pixels including light emitting elements are formed.

Accordingly, the inventors of the present disclosure have intended to improve reliability of the foldable display device by improving surface hardness of a thin tempered glass or film type foldable cover window.

In addition, the inventors of the present disclosure have intended to improve impact resistance of the foldable cover window by minimizing the stacked structure disposed under the foldable display panel.

Additionally, the inventors of the present disclosure have recognized that dent marks may be permanently maintained as the dent recovery ability of the foldable display device decreases. Specifically, the inventors of the present disclosure have recognized that the dent recovery ability of the foldable display device may vary depending on a stacked structure of a rear surface of the foldable display panel and the foldable cover window.

Accordingly, an object to be achieved by the present disclosure is to provide a foldable display device capable of simultaneously providing excellent surface hardness, excellent flexibility, and excellent dent recovery ability.

Objects of the present disclosure are not limited to the above-mentioned objects, and other objects, which are not mentioned above, can be clearly understood by those skilled in the art from the following descriptions.

According to an aspect of the present disclosure, a foldable display device includes a foldable display panel; and a foldable cover window located on the foldable display panel and including a flexible film and a first hard coating layer located on the flexible film, wherein the first hard coating layer includes a material in which a siloxane-based resin and a urethane-acrylic-based, acrylic-based, or epoxy-based linker are combined.

According to another aspect of the present disclosure, a foldable display device includes a foldable cover window; a foldable display panel disposed on a rear surface of the foldable cover window; a plate bottom disposed on a rear surface of the foldable display panel; a cushion layer disposed on a rear surface of the plate bottom; and a plurality of adhesive members respectively disposed among the foldable cover window, the foldable display panel, the plate bottom, and the cushion layer.

Other detailed matters of the exemplary embodiments are included in the detailed description and the drawings.

According to exemplary embodiments of the present disclosure, the foldable display device has effects of simultaneously providing excellent surface hardness, excellent flexibility, and excellent dent recovery ability.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is located or disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The same reference numerals refer to the same components throughout the specification.

The size and thickness of each component illustrated in the drawings are illustrated for convenience of description, and the present disclosure is not necessarily limited to the drawings.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1:
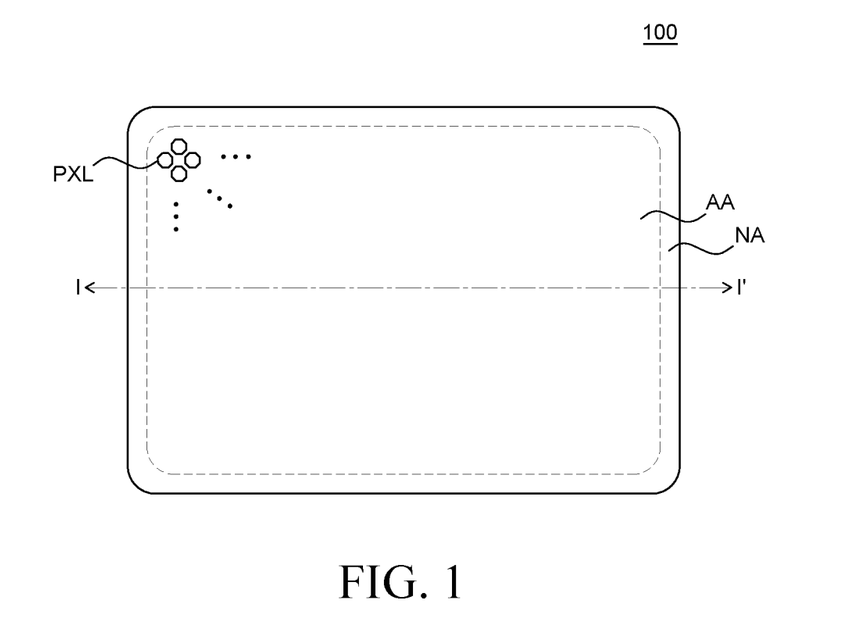
FIG. 1 is a schematic plan view of a foldable display device according to an exemplary embodiment of the present disclosure.
Figure 2:
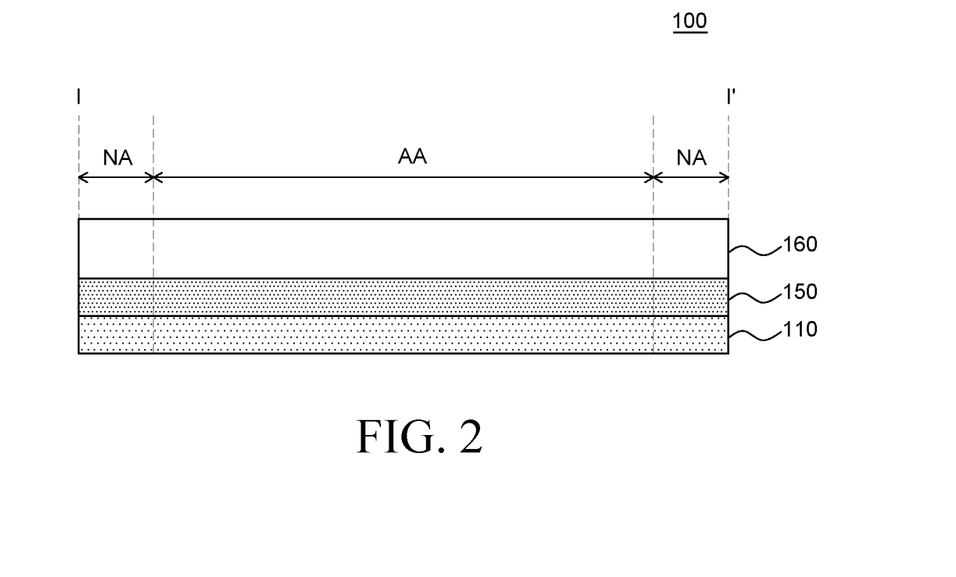
FIG. 2 is a schematic cross-sectional view of the foldable display device, taken along line I-I' of FIG. 1.

FIG. 1 is a plan view of a foldable display device according to an exemplary embodiment of the present disclosure. FIG. 2 is a schematic cross-sectional view of the foldable display device, taken along line I-I' of FIG. 1.

Hereinafter, a foldable display device 100 according to an exemplary embodiment of the present disclosure will be described with reference to FIGS. 1 and 2.

With reference to FIG. 1, the foldable display device 100 may be divided into a display area AA and a non-display area NA.

The display area AA is an area for displaying an image, and a plurality of pixels PXL for displaying the image may be provided in the display area AA.

The pixel PXL disposed in the display area AA may include a display element and a thin film transistor for driving the display element.

By way example, when the foldable display device 100 is an organic light emitting display device, the display element of the pixel PXL may include an organic light emitting element. However, the present disclosure is not limited thereto, and the display element may also be implemented as an inorganic light emitting display device, a quantum-dot light emitting display device, a micro-LED display device, or a mini-LED display device. Hereinafter, for convenience of description, it will be described that the display element includes an organic light emitting element. However, the present disclosure is not limited thereto.

The non-display area NA is an area where an image is not displayed, and in the non-display area NA, circuits, lines, components and the like for driving the display element of the display area AA are disposed. Driving circuits and the like, such as a gate driver and a data driver, may be disposed in the non-display area NA. For example, the driving circuit may be formed in the non-display area NA by a gate-in-panel (GIP) method, or may be implemented by a method such as a tape carrier package (TCP) or chip on film (COF) method. The non-display area NA may be defined as an area surrounding the display area AA, as illustrated in FIG. 1. However, the present disclosure is not limited thereto, and the non-display area NA may be defined as a peripheral area of the display area AA, and may be defined as an area where no pixel PXL is disposed. Since no pixel is disposed in the non-display area NA, the non-display area NA may be configured to further include a decoration film or a black matrix that substantially shields visible light of the non-display area. However, the present disclosure is not limited thereto Referring back to FIG. 2, the foldable display device 100 according to an exemplary embodiment of the present disclosure may be configured to include at least a foldable display panel 110, a transparent adhesive member 150, and a foldable cover window 160. The transparent adhesive member 150 may be configured to be disposed on the foldable display panel 110 to fix the foldable cover window 160 and the foldable display panel 110 to each other.

The foldable display device 100 according to an exemplary embodiment of the present disclosure is characterized in that the foldable display panel 110, the transparent adhesive member 150, and the foldable cover window 160 are disposed therein, in consideration of surface hardness, flexibility, and dent recovery ability.

Figure 3:
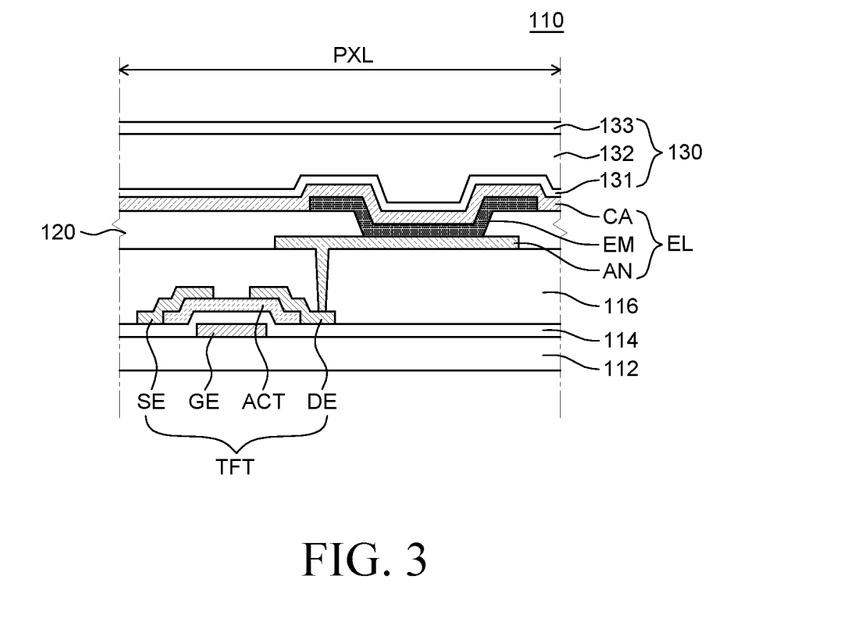
FIG. 3 is a cross-sectional view schematically illustrating a foldable display panel of the foldable display device according to an exemplary embodiment of the present disclosure.

FIG. 3 is a cross-sectional view schematically illustrating a foldable display panel of the foldable display device according to an exemplary embodiment of the present disclosure.

Hereinafter, the foldable display panel 110 will be described in more detail with reference to FIGS. 1 to 3.

A plurality of the pixels PXL are disposed in the display area AA of the foldable display panel 110 according to an exemplary embodiment of the present disclosure. The pixel PXL may include a light emitting element EL and a transistor TFT.

The foldable display panel 110 may include a flexible substrate 112, the transistor TFT, a gate insulating layer 114, a planarization layer 116, the light emitting element EL, and an encapsulation part 130.

The flexible substrate 112 is a base member for supporting components included in the foldable display panel 110 and may be formed of an insulating material. The flexible substrate 112 may be formed of a material having flexibility, for example, a plastic material such as polyimide or the like.

The transistor TFT is disposed on the flexible substrate 112. The transistor TFT may include a gate electrode GE, an active layer ACT, a source electrode SE, and a drain electrode DE. FIG. 3 illustrates an example of the transistor TFT having a bottom gate structure in which the gate electrode GE is disposed under the active layer ACT, but the present disclosure is not limited thereto.

The gate electrode GE of the transistor TFT is disposed on the flexible substrate 112. The gate electrode GE may be formed of a conductive material, for example, copper (Cu), aluminum (Al), molybdenum (Mo), titanium (Ti), or alloys thereof, but the present disclosure is not limited thereto.

The gate insulating layer 114 is disposed on the gate electrode GE. The gate insulating layer 114 is a layer for insulating the gate electrode GE and the active layer ACT from each other, and may be formed of an insulating material. For example, the gate insulating layer 114 may be formed of a single layer or multilayers of silicon oxide (SiOx) or silicon nitride (SiNx), but is not limited thereto.

The active layer ACT is disposed on the gate insulating layer 114. The active layer ACT may be formed of an oxide semiconductor, an organic semiconductor, amorphous silicon, polysilicon or the like.

The source electrode SE and the drain electrode DE spaced apart from each other are disposed on the active layer ACT. The source electrode SE and the drain electrode DE may be electrically connected to the active layer ACT. The source electrode SE and the drain electrode DE may be formed of a conductive material, for example, copper (Cu), aluminum (Al), molybdenum (Mo), titanium (Ti), or alloys thereof, but are not limited thereto.

Meanwhile, although not illustrated in the drawings, a buffer layer may be disposed between the flexible substrate 112 and the transistor TFT. The buffer layer may prevent penetration of moisture or impurities through the flexible substrate 112. However, the buffer layer is not necessarily required, and may be selectively disposed according to a type of the flexible substrate 112 or a type or the like of the transistor TFT.

The planarization layer 116 planarizes an upper portion of the transistor TFT. The planarization layer 116 may be composed of a single layer or multiple layers, and may be formed of an organic material. For example, the planarization layer 116 may be formed of an acrylic-based organic material, but is not limited thereto. The planarization layer 116 includes a contact hole CT for electrically connecting the transistor TFT and the light emitting element EL.

The light emitting element EL is disposed on the planarization layer 116. The light emitting element EL is a self-light emitting element that emits light and may be driven by the transistor TFT disposed in each pixel PXL. The light emitting element EL may include an anode AN, a light emitting layer EM, and a cathode CA.

The anode AN is separately disposed for each pixel PXL on the planarization layer 116. The anode AN is electrically connected to the drain electrode DE of the transistor TFT through the contact hole CT formed in the planarization layer 116. The anode AN is formed of a conductive material capable of supplying holes to the light emitting layer EM. For example, the anode AN may be formed of a transparent conductive material such as tin oxide (TO), indium tin oxide (ITO), indium zinc oxide (IZO), indium tin zinc oxide (ITZO) or the like, and a reflective layer formed of a material having excellent reflectivity such as silver (Ag) or silver alloy (Ag alloy), but the present disclosure is not limited thereto. In FIG. 3, the anode AN is shown to be electrically connected to the drain electrode DE of the transistor TFT, but the anode AN may be electrically connected to the source electrode SE of the transistor TFT according to a type of the transistor TFT.

A bank 120 is disposed on the anode AN and the planarization layer 116. The bank 120 is an insulating layer for separating light emitting areas between the pixels PXL adjacent to each other. The bank 120 may be disposed to open a portion of the anode AN, and the bank 120 may be an organic insulating material disposed to cover an edge of the anode AN.

The light emitting layer EM is disposed on the anode AN. The light emitting layer EM may be formed of one light emitting layer or may have a structure in which a plurality of light emitting layers emitting light of different colors are stacked. The emission layer EM may further include a hole injection layer, a hole transport layer, an electron transport layer, and an electron injection layer. With reference to FIG. 3, the light emitting layers EM disposed in the respective pixels PXL are illustrated as being separately disposed for each pixel PXL, but all or a portion of the light emitting layers EM may be formed as a single layer throughout the plurality of pixels PXL.

The cathode CA is disposed on the light emitting layer EM. The cathode CA is formed of a conductive material capable of supplying electrons to the light emitting layer EM. For example, the cathode CA may be formed of a transparent conductive material such as indium tin oxide (ITO), indium zinc oxide (IZO), indium tin zinc oxide (ITZO), zinc oxide (ZnO), and tin oxide (TO), or magnesium (Mg), silver-magnesium (Ag:Mg), an alloy of ytterbium (Yb), an oxide of ytterbium (YbO), or the like. However, the present disclosure is not limited thereto. With reference to FIG. 3, the cathodes CA disposed in the respective pixels PXL are illustrated as being connected to each other, but may be separately disposed for each pixel PXL, similarly to the anode AN.

The encapsulation part 130 is disposed on the light emitting element EL. The encapsulation part 130 is a sealing member that protects the light emitting element EL from external moisture, air, or impacts. The encapsulation part 130 may be formed by stacking a first inorganic layer 131, an organic layer 132, and a second inorganic layer 133. For example, the first inorganic layer 131 or the second inorganic layer 133 may be formed of an inorganic material such as silicon nitride ($SiN_x$), silicon oxide ($SiO_x$), silicon oxide nitride ($SiO_xN_x$), aluminum oxide ($AlO_x$), or the like. For the organic layer 132, an epoxy-based or acrylic-based polymer may be used, but the present disclosure is not limited thereto.

Figure 4:
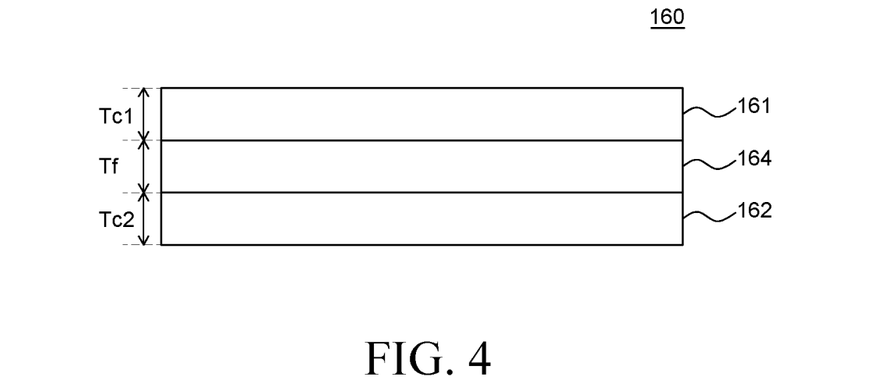
FIG. 4 is a cross-sectional view schematically illustrating a foldable cover window of the foldable display device according to an exemplary embodiment of the present disclosure.

FIG. 4 is a cross-sectional view schematically illustrating a foldable cover window of the foldable display device according to an exemplary embodiment of the present disclosure.

The foldable cover window 160 according to an exemplary embodiment of the present disclosure may be configured to include a first hard coating layer 161, a second hard coating layer 162, and a flexible film 164. In addition, the second hard coating layer 162 is not necessary in some embodiments.

The first hard coating layer 161 is a layer formed on the flexible film 164. The first hard coating layer 161 is formed on an upper surface of the flexible film 164 and is configured to protect the foldable display device 100 from being scratched.

Specifically, the first hard coating layer 161 is characterized by including a material in which a siloxane-based resin as a base material and a urethane-acrylic-based linker, an acrylic-based linker, or an epoxy-based linker as a linker are combined.

The inventors of the present disclosure have recognized that a hard coating material in which a siloxane-based resin and a urethane-acrylic-based, acrylic-based, or epoxy-based linker are combined has significantly reduced brittleness and at the same time, can provide excellent surface hardness.

The first hard coating layer 161 may be formed by combining a urethane-acrylic-based linker, an acrylic-based linker, or an epoxy-based linker with a backbone of a siloxane-based resin in a resin state and then, coating it on the flexible film 164. The first hard coating layer 161 may be formed through a curing process. For example, the first hard coating layer 161 may be cured through a thermal curing, photo-curing, or chemical curing process. The first hard coating layer 161 may be configured to further include an initiator or additive that causes an optical or chemical reaction.

Hereinafter, scratch characteristics of the foldable display device 100 will be described.

The first hard coating layer 161 including the material in which a siloxane-based resin and a urethane-acrylic-based, acrylic-based, or epoxy-based linker are combined, according to an exemplary embodiment of the present disclosure, is configured to have a predetermined surface hardness.

The surface hardness of the foldable display device 100 may be measured according to various test standards. For example, the surface hardness of the foldable display device 100 may be obtained by measuring pencil scratch hardness at a specific vertical load according to ASTM D3363, which is one of international standards. The vertical load can be, for example, 1 Kg, 750 g, 500 g, or 250 g. However, the present disclosure is not limited thereto. To explain further, the pencil scratch hardness can be divided into levels of 9H, 8H, 7H, 6H, 5H, 4H, 3H, 2H, H, F, B, 2B, 3B, 4B, 5B, 6B, 7B, 8B, and 9B. Here, a hardness of 9H is the highest, and a hardness of 9B is the lowest hardness.

The first hard coating layer 161 including the material in which a siloxane-based resin and a urethane-acrylic-based, acrylic-based, or epoxy-based linker are combined, according to an exemplary embodiment of the present disclosure, is configured to have a first thickness Tc1. However, the pencil scratch hardness and the first thickness Tc1 of the first hard coating layer 161 may not correlate with each other. Therefore, the pencil scratch hardness of the first hard coating layer 161 may be maintained substantially the same, regardless of the first thickness Tc1.

The pencil scratch hardness of the first hard coating layer 161 including the material in which a siloxane-based resin and a urethane-acrylic-based, acrylic-based, or epoxy-based linker are combined, according to an exemplary embodiment of the present disclosure, may be 4H in a vertical load test of 750 g. Alternatively, it may be 6H in a vertical load test of 500 g or may be 8H in a vertical load test of 250 g.

In addition, when the pencil scratch hardness of the first hard coating layer 161 is 4H or more in a vertical load test of 750 g, it may mean a high pencil hardness allowing for commercialization. Therefore, the foldable display device 100 comprising the first hard coating layer 161 including the material in which a siloxane-based resin and a urethane-acrylic-based, acrylic-based, or epoxy-based linker are combined, according to an exemplary embodiment of the present disclosure, has effects of providing excellent scratch protection.

Hereinafter, the dent recovery ability of the foldable display device 100 will be described.

The first thickness Tc1 of the first hard coating layer 161 including the material in which a siloxane-based resin and a urethane-acrylic-based, acrylic-based, or epoxy-based linker are combined, according to an exemplary embodiment of the present disclosure, may be 30 μm (microns or micrometres) to 80 μm. Preferably, the first thickness Tc1 of the first hard coating layer 161 including the material in which a siloxane-based resin and a urethane-acrylic-based, acrylic-based, or epoxy-based linker are combined may be 35 μm to 75 μm. More preferably, the first thickness Tc1 of the first hard coating layer 161 including the material in which a siloxane-based resin and a urethane-acrylic-based, acrylic-based, or epoxy-based linker are combined may be 40 μm to 70 μm. Even more preferably, the first thickness Tc1 of the first hard coating layer 161 including the material in which a siloxane-based resin and a urethane-acrylic-based, acrylic-based, or epoxy-based linker are combined may be 60 μm.

If the first thickness Tc1 of the first hard coating layer 161 is less than 30 μm, the dent recovery ability of the foldable display device 100 may be significantly reduced. If the first thickness Tc1 of the first hard coating layer 161 is 80 μm or more, flexibility of the foldable display device 100 may be significantly reduced, and cracks may occur in the first hard coating layer 161 when it is bent.

The bending of the foldable display device 100 means bending with a curvature radius of 4 mm (4R), for example, which is a curvature radius suitable for a foldable display or the like.

When the first thickness Tc1 of the first hard coating layer 161 is 30 μm to 80 μm, there is an effect capable of providing excellent flexibility. For example, when the first thickness Tc1 is 30 μm to 80 μm, a threshold curvature radius of the foldable display device 100 may be 4 mm (4R) or less. In the case of bending with a curvature radius greater than or equal to the threshold curvature radius, there is an effect that cracking may not occur in the hard coating layer 161 during the bending. In addition, the pencil scratch hardness of the foldable display device 100 may be 4H or more in a vertical load test of 750 g, and at the same time, the dent recovery ability may be improved.

That is, when a thickness of a hard coating material in which a siloxane-based resin and a urethane-acrylic-based, acrylic-based, or epoxy-based linker are combined is formed to be 30 μm to 80 μm, brittleness of the foldable cover window 160 may be significantly reduced when it is bent. And, excellent surface hardness may be provided at the same time, the dent recovery ability can be improved.

Since the second hard coating layer 162 according to an exemplary embodiment of the present disclosure is formed on a rear surface of the flexible film 164, it does not directly contact a sharp material such as a pen or pencil. Therefore, the second hard coating layer 162 is characterized in that it is designed by first considering the dent recovery ability of the foldable display device 100.

The second hard coating layer 162 including a material in which a siloxane-based resin and a urethane-acrylic-based, acrylic-based, or epoxy-based linker are combined, according to an exemplary embodiment of the present disclosure, is configured to have a second thickness Tc2.

The second hard coating layer 162 is formed by combining a urethane-acrylic-based, acrylic-based, or epoxy-based linker with a siloxane-based resin in a resin state, and then, applied to the rear surface of the flexible film 164. The second hard coating layer 162 may be formed through a curing process.

The second thickness Tc2 of the second hard coating layer 162 including the material in which a siloxane-based resin and a urethane-acrylic-based, acrylic-based, or epoxy-based linker are combined, according to an exemplary embodiment of the present disclosure, may be 30 μm to 80 μm. Preferably, the second thickness Tc2 of the second hard coating layer 162 including the material in which a siloxane-based resin and a urethane-acrylic-based, acrylic-based, or epoxy-based linker are combined may be 35 μm to 75 μm. More preferably, the second thickness Tc2 of the second hard coating layer 162 including the material in which a siloxane-based resin and a urethane-acrylic-based, acrylic-based, or epoxy-based linker are combined may be 40 μm to 70 μm. Even more preferably, the second thickness Tc2 of the second hard coating layer 162 including the material in which a siloxane-based resin and a urethane-acrylic-based, acrylic-based, or epoxy-based linker are combined may be 60 μm.

If the second thickness Tc2 of the second hard coating layer 162 is less than 30 μm, the dent recovery ability of the foldable display device 100 may be significantly reduced. If the second thickness Tc2 of the second hard coating layer 162 is 80 μm or more, the flexibility of the foldable display device 100 may be significantly reduced, and cracks may occur in the second hard coating layer 162 when it is bent.

According to a configuration described above, the second hard coating layer 162 is formed on the rear surface of the flexible film 164, so it is feasible to reduce deformation of the first hard coating layer 161 and the flexible film 164 by external force. Accordingly, the second hard coating layer 162 may improve the dent recovery ability of the foldable cover window 160, and the dent recovery ability of the foldable display device 100 according to an exemplary embodiment of the present disclosure may be improved.

That is, the second hard coating layer 162 may be configured to provide excellent dent recovery ability. In addition, when the second thickness Tc2 of the second hard coating layer 162 is 30 μm to 80 μm, there is an effect capable of providing excellent flexibility. For example, when the second thickness Tc2 is 30 μm to 80 μm, the threshold curvature radius of the foldable display device 100 may be maintained to be 4 mm (4R) or less, and there is an effect that cracking may not occur in the second coating layer 162 by the bending with a curvature radius greater than or equal to the threshold curvature radius.

The thicknesses of the first hard coating layer 161 and the second hard coating layer 162 may be configured to be substantially the same as each other. When the thicknesses of the first hard coating layer 161 and the second hard coating layer 162 are the same as each other, there is an effect capable of reducing curling or curl occurrence of the foldable cover window 160.

The second hard coating layer 162 may be configured to be relatively thicker than the first hard coating layer 161. When the second hard coating layer 162 is thicker than the first hard coating layer 161, there is an effect of further enhancing the dent recovery ability.

The flexible film 164 is configured to support the first hard coating layer 161 and the second hard coating layer 162. The flexible film 164 is configured to provide excellent flexibility. The flexible film 164 may be formed of at least one material of transparent polyimide, triacetate cellulose (TAC), acryl, polyethylene terephthalate (PET), polycarbonate (PEN), and polyethylene naphthalate (PEN).

A thickness Tf of the flexible film 164 may be 30 μm to 80 μm. Preferably, the thickness of the flexible film 164 may be 50 μm.

In a case in which the thickness Tf of the flexible film 164 is 30 μm or less, the first hard coating layer 161 and the second hard coating layer may have a reduced flatness when formed. In addition, curling or curl occurrence of the foldable cover window 160 may be caused by a difference in deformation between the flexible film 164 and the first hard coating layer 161 or the second hard coating layer 162 in a high temperature and high humidity environment. When the thickness Tf of the flexible film 164 is 80 μm or more, curling or curl occurrence of the foldable cover window 160 may be caused by a difference in deformation between the flexible film 164 and the first hard coating layer 161 or the second hard coating layer 162 in a high temperature and high humidity environment. That is, thicknesses of the flexible film 164, and the first hard coating layer 161 and the second hard coating layer 162 may be selected to have a thickness ratio at which the deformation of the foldable cover window 160 can be minimized.

The foldable cover window 160 is configured to include the first hard coating layer 161, the second hard coating layer 162, and the flexible film 164, and a thickness of the foldable cover window 160 may be 150 μm to 250 μm. The thickness of the foldable cover window 160 may be the sum of the first thickness Tc1 of the first hard coating layer 161, the second thickness Tc2 of the second hard coating layer 162, and the thickness Tf of the flexible film 164.

If the thickness of the foldable cover window 160 is 150 μm or less, the dent recovery ability may be lowered. If the thickness of the foldable cover window 160 is 250 μm, the threshold curvature radius of 4 mm (4R) may not be achieved.

In summary, the foldable cover window 160 according to an exemplary embodiment of the present disclosure may have effects of optimizing flexibility, surface hardness and dent recovery ability by controlling the thicknesses of the first hard coating layer 161, the second hard coating layer 162, and the flexible film 164.

However, the present disclosure is not limited to the foldable cover window including the hard coating layer, and the foldable cover window may be formed of tempered glass.

The transparent adhesive member 150 is configured to fix the foldable cover window 160 and the foldable display panel 110 to each other. The transparent adhesive member 150 may be formed of, for example, optical clear adhesive (OCA), pressure sensitive adhesive (PSA), or the like, but is not limited thereto. For example, when the transparent adhesive member 150 is formed of the OCA, adhesion may be controlled by adding an additive to the OCA. For example, an additive that causes heat, UV, light, chemical reactions or the like may be mixed in the transparent adhesive member 150. However, the present disclosure is not limited thereto.

To secure folding characteristics of the transparent adhesive member 150, a thickness of the transparent adhesive member 150 may be 10 um to 50 um. In addition, the adhesion of the transparent adhesive member 150 may be 0.9 kgf/inch or more in room or high temperature and high humidity environments. A light temperature modulus of the transparent adhesive member 150 may be $10^3$ Pa (pascals) to $10^6$ Pa. Preferably, the light temperature modulus of the transparent adhesive member 150 may be $10^4$ Pa to $10^5$ Pa. The light temperature modulus means modulus in low temperature, room temperature, and high temperature environments.

According to a configuration described above, there is an effect that reliability can be improved by light temperature modulus characteristics of the transparent adhesive member 150. In addition, there is an effect that the flexibility of the foldable display device 100 can be improved.

In some embodiments, the foldable cover window may be formed of tempered glass, not the hard coating layer and the flexible film. When the foldable cover window is a foldable cover glass, a thickness of the glass may be 60 μm to 80 μm, more preferably 70 μm. Here, the foldable cover window may be a foldable cover glass on which several processing processes for improving folding characteristics have been additionally performed. Here, the foldable cover glass may be a glass substrate, in which polishing has been performed on a side thereof to which folding stress is applied, so as to improve folding characteristics. In addition, the foldable cover glass may be a glass substrate, in which a side thereof to which folding stress is applied has been chamfered by an etching process to improve folding characteristics. Additionally, the chamfered side to which folding stress is applied may have a taper, and a taper ratio may be 40% or more with respect to a total thickness of the foldable cover glass. That is, when the thickness of the foldable cover glass is 70 μm, a thickness of the taper may be 28 μm or more. According to a configuration described above, since it is feasible to remove fine cracks or chips existing in a specific area where tensile stress of the foldable cover glass is generated, through polishing, there is an effect of improving the folding characteristics of the foldable cover glass. In addition, the threshold curvature radius of the foldable cover glass may be reduced by adjusting the taper ratio of the foldable cover glass.

Figure 5:
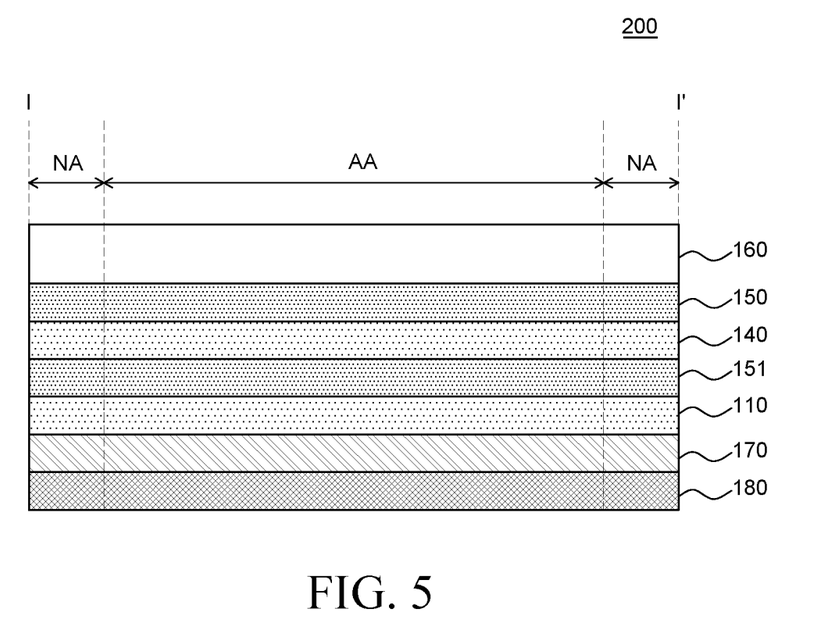
FIG. 5 is a cross-sectional view schematically illustrating a stacked structure of a foldable display device according to another exemplary embodiment of the present disclosure.

FIG. 5 is a cross-sectional view schematically illustrating a stacked structure of a foldable display device according to another exemplary embodiment of the present disclosure.

Since a foldable display device 200 according to another exemplary embodiment of the present disclosure includes multiple components substantially similar to those of the foldable display device 100 according to an exemplary embodiment of the present disclosure, duplicated descriptions will be omitted for convenience of explanation.

With reference to FIG. 5, the foldable display device 200 according to another exemplary embodiment of the present disclosure may include the foldable cover window 160, a foldable polarizing plate 140, the foldable display panel 110, and a back plate 180.

A plurality of adhesive members that may be disposed between the foldable display panel 110 and the foldable cover window 160 are transparent adhesive members 150 and 151 having excellent visible light transmission characteristics for displaying an image of the foldable display panel 110.

The foldable polarizing plate 140 capable of absorbing external light may be disposed between the foldable display panel 110 and the foldable cover window 160 to improve an external light contrast ratio. However, the present disclosure is not limited thereto. For example, the foldable polarizing plate 140 may be selectively disposed or may not be disposed in some cases.

The first adhesive member 170 may bond the foldable display panel 110 and the foldable back plate 180. Since the first adhesive member 170 is located on a rear surface of the foldable display panel 110, visible light transmittance is not limited thereby. The first adhesive member 170 may be formed of, for example, optical clear adhesive (OCA) or pressure sensitive adhesive (PSA), but is not limited thereto. For example, when the first adhesive member 170 is formed of OCA, adhesion may be controlled by adding an additive to the OCA. For example, an additive that causes heat, UV, light, chemical reaction, or the like may be mixed in the first adhesive member 170. However, the present disclosure is not limited thereto. A light temperature modulus of the first adhesive member 170 may be $10^3$ Pa to $10^6$ Pa. Preferably, the light temperature modulus of the first adhesive member 170 may be $10^4$ Pa to $10^5$ Pa. According to a configuration described above, light temperature modulus characteristics of the first adhesive member 170 may allow for improvements in reliability. Also, flexibility of the foldable display device 200 may be improved. To secure folding characteristics of the first adhesive member 170, a thickness thereof may be 10 um to 50 um. In addition, the adhesion of the first adhesive member 170 may be 0.9 kgf/inch or more in room or high temperature and high humidity environments.

The foldable back plate 180 may be disposed on the rear surface of the foldable display panel 110. The foldable back plate 180 may mean a back plate 180 having excellent folding characteristics. When the foldable display panel 110 is too thin, the foldable back plate 180 may be attached to the rear surface of the foldable display panel 110 to support the foldable display panel 110.

The foldable back plate 180 may include one selected from among polyurethane (PU), thermoplastic polyurethane (TPU), silicone (Si), polydimethylacrylamide (PDMA), a metal material such as amorphous metal, polymethyl methacrylate (PMMA), polycarbonate (PC), polyvinylalcohol (PVA), acrylonitrile-butadiene-styrene (ABS), or polyethylene terephthalate (PET). In this case, a thickness of the foldable back plate 180 may be 100 μm to 400 μm. According to the above-described thickness, there is an effect capable of improving impact resistance without lowering folding characteristics. In addition, when the thickness is 100 μm or less, improvements in impact resistance properties of the foldable display device 200 may be inadequate. When the thickness is 400 μm or more, folding characteristics may rapidly decrease.

Additionally, the foldable back plate 180 attached to the rear surface of the foldable display panel 110 has an effect of absorbing impacts of the foldable display device 200. In particular, by providing the foldable back plate 180 when the foldable cover window 160 is implemented in a thin form for folding characteristics, damage to the foldable cover window 160 and the foldable display panel 110 may be reduced.

For example, for testing reliability of the foldable display device 100 according to an exemplary embodiment of the present disclosure shown in FIG. 2 and reliability of the foldable display device 200 according to another exemplary embodiment of the present disclosure shown in FIG. 5, a ball-drop test in which a steel ball having a weight of 21.68 g and a diameter of 17.5 mm was freely dropped at a predetermined height, was performed.

When a free fall height was 2.5 cm, the foldable cover window 160 of the foldable display device 100 without the foldable back plate 180 was damaged or permanently deformed, but the foldable cover window 160 of the foldable display device 200 provided with the foldable back plate 180 was not damaged or permanently deformed.

Figure 6:
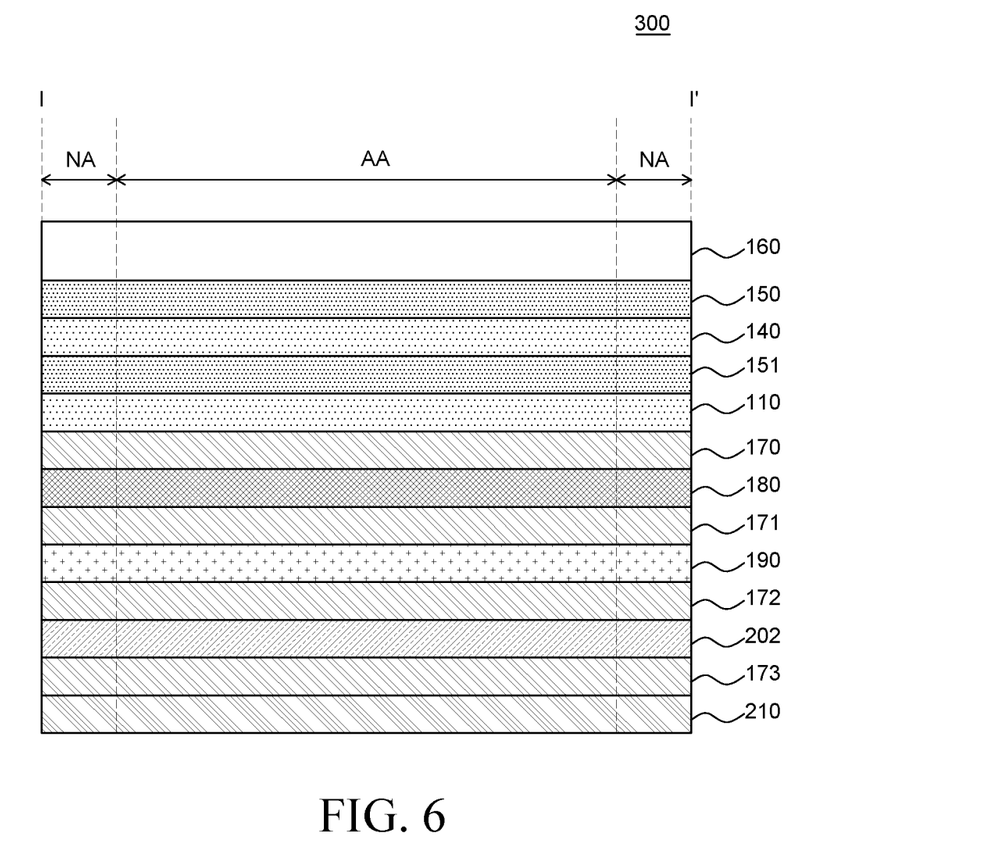
FIG. 6 is a cross-sectional view schematically illustrating a stacked structure of a foldable display device according to still another exemplary embodiment of the present disclosure.

FIG. 6 is a cross-sectional view schematically illustrating a stacked structure of a foldable display device according to still another exemplary embodiment of the present disclosure.

Since a foldable display device 300 according to still another exemplary embodiment of the present disclosure includes multiple components substantially similar to those of the foldable display device 200 according to another exemplary embodiment of the present disclosure, duplicated descriptions will be omitted for convenience of explanation.

With reference to FIG. 6, the foldable display device 300 according to another exemplary embodiment of the present disclosure may further include a plate top 190 (which may also be referred to herein as a top plate 190), a plate bottom 202 (which may also be referred to herein as a bottom plate 202), and a cushion layer 210, compared to the foldable display device 200 according to another exemplary embodiment of the present disclosure.

A stacked structure of the plate top 190, the plate bottom 202, and the cushion layer 210 is a structure configured to improve rigidity of the foldable display device 300.

The plate top 190 may be formed of a metal material having a Young's modulus (which may also be referred to herein as a modulus of elasticity) of 100 GPa (gigapascal) or more and a thickness of 20 μm to 200 μm. The plate bottom 202 may be formed of a metal material having a Young's modulus of 100 GPa or more and a thickness of 20 μm to 200 μm. The cushion layer 210 may be formed of a material containing a foam having a Young's modulus of 0.01 MPa (megapascal) to 30 MPa and a thickness of 100 μm to 1000 μm. For example, the cushion layer 210 may be formed of one of a polyurethane foam, a silicone foam, an acrylic foam, and a polypropylene foam. However, the present disclosure is not limited thereto.

Since a second adhesive member 171, a third adhesive member 172, and a fourth adhesive member 173 are located on the rear surface of the foldable display panel 110, visible light transmittance are not limited thereby. The second to fourth adhesive members 171, 172, and 173 may be formed of a material substantially the same as that of the first adhesive member 170. The respective adhesive members may be disposed among the plate top 180, the plate bottom 200, and the cushion layer 210.

According to a configuration described above, the plate top 190, the plate bottom 200, and the cushion layer 210 may be disposed on the rear surface of the foldable display panel 110, thereby reducing permanent damage such as being broken, being dent or being pressed due to impacts applied to the foldable cover window 160 and the foldable display panel 110.

For example, for testing reliability of the foldable display device 200 according to another exemplary embodiment of the present disclosure shown in FIG. 5 and reliability of the foldable display device 300 according to another exemplary embodiment of the present disclosure shown in FIG. 6, a ball-drop test in which a steel ball having a weight of 21.68 g and a diameter of 17.5 mm was freely dropped at a predetermined height, was performed.

When a free fall height was 10 cm, the foldable cover window 160 of the foldable display device 200 without the plate top 190, the plate bottom 200, and the cushion layer 210 was damaged or permanently deformed, but the foldable cover window 160 of the foldable display device 300 provided with the plate top 190, the plate bottom 202, and the cushion layer 210 was not damaged or permanently deformed.

Here, when the foldable cover window 160 was implemented as a foldable cover glass, it was not damaged at the free fall height of 10 cm, but when the foldable cover window 160 was implemented as a hard coating layer and a flexible film, it was not damaged at the free fall height of 12.5 cm. That is, when the foldable cover window 160 was implemented as a hard coating layer and a flexible film, there is an effect that durability can be further improved.

Figure 7:
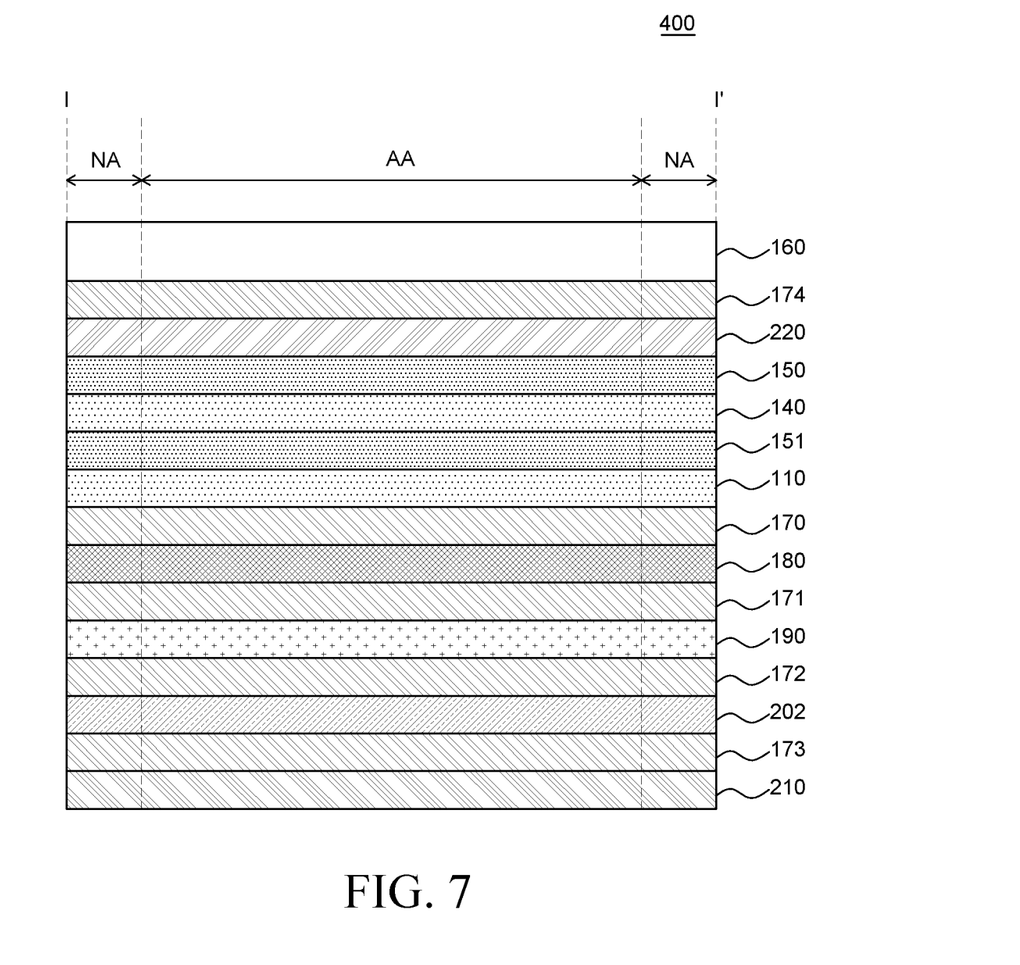
FIG. 7 is a cross-sectional view schematically illustrating a stacked structure of a foldable display device according to still another exemplary embodiment of the present disclosure.

FIG. 7 is a cross-sectional view schematically illustrating a stacked structure of a foldable display device according to still another exemplary embodiment of the present disclosure.

Since a foldable display device 400 according to still another exemplary embodiment of the present disclosure includes multiple components substantially similar to those of the foldable display device 300 according to still another exemplary embodiment of the present disclosure, duplicated descriptions will be omitted for convenience of explanation.

With reference to FIG. 7, the foldable display device 400 according to still another exemplary embodiment of the present disclosure may further include a decoration film 220, compared to the foldable display device 300 according to still another exemplary embodiment of the present disclosure. A fifth transparent adhesive member 174 may be additionally disposed between the decoration film 220 and the foldable cover window 160.

The decoration film 220 may be formed of a transparent material including a foam having a Young's modulus of 1 GPa or less and a thickness of 10 μm to 100 μm. The decoration film 220 may be formed of a polymer-coated or stretched polymer film. The decoration film 220 may form a light blocking layer such as a black matrix in the non-display area NA. The decoration film 220 may be configured to further include a touch panel. The touch panel is a component that detects a user's touch input, such as a screen touch or gesture, to the foldable display device 400, and may be implemented in a capacitance manner or the like. However, the present disclosure is not limited thereto.

According to a configuration described above, the decoration film 220 may be disposed on an upper surface of the foldable display panel 110, thereby reducing permanent damage such as being broken, being dent or being pressed due to impacts applied to the foldable cover window 160 and the foldable display panel 110.

For example, for testing reliability of the foldable display device 300 according to still another exemplary embodiment of the present disclosure shown in FIG. 6 and reliability of the foldable display device 400 according to still another exemplary embodiment of the present disclosure shown in FIG. 7, a ball-drop test in which a steel ball having a weight of 21.68 g and a diameter of 17.5 mm was freely dropped at a predetermined height, was performed.

When a free fall height was 12.5 cm, the foldable cover window 160 of the foldable display device 300 without the decoration film 220 was damaged or permanently deformed, but the foldable cover window 160 of the foldable display device 400 provided with the decoration film 220 was not damaged or permanently deformed.

Here, when the foldable cover window 160 was implemented as a foldable cover glass, it was not damaged at the free fall height of 12.5 cm, but when the foldable cover window 160 was implemented as a hard coating layer and a flexible film, it was not damaged at a free fall height of 15 cm. That is, when the foldable cover window 160 was implemented as a hard coating layer and a flexible film, there is an effect that durability can be further improved.

That is, the foldable cover window 160 and the foldable display panel 110 have a thin structure for folding characteristics. In this case, reliability of the foldable cover window 160 and the foldable display panel 110 may be lowered. However, by providing additional structures disclosed in various exemplary embodiments of the present disclosure, even when structures of the foldable cover window 160 and the foldable display panel 160 are not changed, durability of the foldable display device may be improved. In particular, durability of the foldable cover window 160 and the foldable display panel 110 may be improved.

The exemplary embodiments of the present disclosure can also be described as follows:

According to an aspect of the present disclosure, there is provided a foldable display panel. A foldable display device, comprising: a foldable display panel; and a foldable cover window located on the foldable display panel and including a flexible film and a first hard coating layer located on the flexible film, wherein the first hard coating layer includes a material in which a siloxane-based resin and a urethane-acrylic-based, acrylic-based, or epoxy-based linker are combined.

A thickness of the first hard coating layer may be 30 μm to 80 μm, and the first hard coating layer has a pencil scratch hardness of 4H or more when measured at a vertical load of 750 g according to ASTM D3363.

A thickness of the first hard coating layer may be equal to or greater than a thickness of the flexible film.

A thickness of the flexible film is 30 μm to 80 μm.

The foldable cover window may further include a second hard coating layer located on a rear surface of the flexible film.

The second hard coating layer may be formed of a same material as the first hard coating layer.

The second hard coating layer may be formed of a different material from the first hard coating layer.

A thickness of the first hard coating layer and a thickness of the second hard coating layer may be substantially the same as each other.

A thickness of the first hard coating layer and a thickness of the second hard coating layer may be different from each other.

The foldable display device may further comprising: first and second transparent adhesive members disposed between the foldable cover window and the foldable display panel, wherein a light temperature modulus of the first and second transparent adhesive members is $10^3$ Pa to $10^6$ Pa.

A thickness of the foldable cover window is 150 μm to 250 μm.

The foldable display device may further comprising: a foldable polarizing plate disposed between the first and second transparent adhesive members; a back plate disposed on a rear surface of the foldable display panel; and a first adhesive member disposed between the foldable display panel and the back plate.

The foldable display device may further comprising: a plate top disposed on a rear surface of the back plate with a second adhesive member therebetween; a plate bottom disposed on a rear surface of the plate top with a third adhesive member therebetween; and a cushion layer disposed on a rear surface of the plate bottom with a fourth adhesive member therebetween.

The foldable display device may further comprising: a decoration film disposed between the foldable cover window and the first transparent adhesive member.

According to another aspect of the present disclosure, A foldable display device, comprising: a foldable cover window;
a foldable display panel disposed on a rear surface of the foldable cover window; a plate bottom disposed on a rear surface of the foldable display panel; a cushion layer disposed on a rear surface of the plate bottom; and a plurality of adhesive members respectively disposed among the foldable cover window, the foldable display panel, the plate bottom, and the cushion layer.

The foldable display device may further comprising: a foldable polarizing plate disposed between the foldable cover window and the foldable display panel; and a back plate disposed between the display panel and the plate bottom.

The foldable display device may further comprising: a back plate disposed between the display panel and the plate bottom; and a plate top disposed between the back plate and the plate bottom.

The foldable display device may further comprising: a foldable polarizing plate disposed between the foldable cover window and the foldable display panel; a back plate disposed between the display panel and the plate bottom; and a plate top disposed between the back plate and the plate bottom.

The foldable display device may further comprising: a decoration film disposed between the foldable cover window and the foldable display panel; a foldable polarizing plate disposed between the decoration film and the foldable display panel; a back plate disposed between the display panel and the plate bottom; and a plate top disposed between the back plate and the plate bottom.

The foldable cover window may include a material in which a siloxane-based resin and a urethane-acrylic-based, acrylic-based, or epoxy-based linker are combined.

The plate top and the plate bottom may include a metal material having a Young's modulus of 100 GPa or more and a thickness of 20 μm to 200 μm.

The cushion layer may include a foam having a Young's modulus of 0.01 MPa to 30 MPa and a thickness of 100 μm to 1000 μm.

The decoration film may include a film having a Young's modulus of 100 GPa or less and a thickness of 10 μm to 100 μm.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A device, comprising:
a foldable display device being a multi-layer stack, the multi-layer stack including:
    a foldable display panel including an active area and a non-active area surrounding the active area;
    a foldable cover window located on the foldable display panel, the foldable cover window including a flexible film and a hard coating layer on the flexible film, the foldable cover window further including at least two first adhesive layers;
    a decoration film being a transparent material and disposed on the foldable display panel, the decoration film including a black matrix corresponding to the non-active area of the foldable display panel;
    a back plate disposed on a rear surface of the foldable display panel;
    a second adhesive layer disposed between the foldable display panel and a top surface of the back plate;
    a top plate disposed on a rear surface of the back plate;
    a third adhesive layer disposed between the back plate and the top plate;
    a bottom plate disposed on a rear surface of the top plate;
    a fourth adhesive layer disposed between the top plate and the bottom plate; and
    a cushion layer disposed on a rear surface of the bottom plate,
    wherein the foldable display panel, the foldable cover window, the decoration film, the back plate, the top plate and the bottom plate having a folding area.

2. The device of claim 1, wherein the bottom plate includes at least a continuous portion.

3. The device of claim 1, wherein the top plate is a single continuous layer.

4. The foldable display device of claim 1, wherein the hard coating layer of the foldable cover window is a first hard coating layer, the foldable cover window including a second hard coating layer.

5. The foldable display device of claim 4, wherein the first hard coating layer and the second hard coating layer are on opposite sides of the flexible film of the foldable cover window.

6. The foldable display device of claim 1, wherein the foldable display panel includes a light emitting element and an encapsulation layer, the foldable display device further comprising:
a layer including a touch assembly configured to detect a touch input, the touch assembly disposed on the encapsulation layer of the foldable display panel.

7. The device of claim 1, wherein the foldable cover window is a top most layer in the multi-layer stack.

8. The foldable display device of claim 1, further comprising:
at least one fifth adhesive layer between the decoration film and the foldable display panel.

9. The foldable display device of claim 1, wherein the first adhesive layer is one of at least two first adhesive layers between the decoration film and the foldable display panel.

10. The foldable display device of claim 1, wherein the second adhesive layer is disposed directly on the foldable display panel and directly on the top surface of the back plate.

* * * * *